(12) United States Patent
Jain et al.

(10) Patent No.: US 10,964,625 B2
(45) Date of Patent: Mar. 30, 2021

(54) DEVICE AND METHOD FOR DIRECT LIQUID COOLING VIA METAL CHANNELS

(71) Applicant: Google LLC, Mountain View, CA (US)

(72) Inventors: Padam Jain, San Jose, CA (US); Yuan Li, Sunnyvale, CA (US); Teckgyu Kang, Saratoga, CA (US); Madhusudan Iyengar, Foster City, CA (US)

(73) Assignee: Google LLC, Mountain View, CA (US)

( * ) Notice: Subject to any disclaimer, the term of this patent is extended or adjusted under 35 U.S.C. 154(b) by 106 days.

(21) Appl. No.: 16/286,406

(22) Filed: Feb. 26, 2019

(65) Prior Publication Data

US 2020/0273777 A1    Aug. 27, 2020

(51) Int. Cl.
| | |
|---|---|
| *H01L 23/34* | (2006.01) |
| *H01L 23/473* | (2006.01) |
| *H01L 21/56* | (2006.01) |
| *H01L 21/768* | (2006.01) |
| *H01L 23/31* | (2006.01) |
| *H01L 23/367* | (2006.01) |
| *H01L 23/373* | (2006.01) |

(Continued)

(52) U.S. Cl.
CPC .......... *H01L 23/473* (2013.01); *H01L 21/565* (2013.01); *H01L 21/76871* (2013.01); *H01L 23/3142* (2013.01); *H01L 23/367* (2013.01); *H01L 23/3736* (2013.01); *H01L 23/53238* (2013.01); *H01L 23/53252* (2013.01); *H05K 7/20272* (2013.01)

(58) Field of Classification Search
CPC .............. H01L 21/565; H01L 21/76871; H01L 23/3142; H01L 23/367; H01L 23/3736; H01L 23/473; H01L 23/53238; H01L 23/53252; H05K 7/2029; H05K 7/2089; H05K 7/20954
USPC ........................................................ 257/714
See application file for complete search history.

(56) References Cited

U.S. PATENT DOCUMENTS

| | | | |
|---|---|---|---|
| 4,928,207 A | 5/1990 | Chrysler et al. | |
| 5,309,319 A | 5/1994 | Messina | |

(Continued)

FOREIGN PATENT DOCUMENTS

| | | |
|---|---|---|
| CN | 107678524 A | 2/2018 |
| CN | 109121369 A | 1/2019 |

(Continued)

OTHER PUBLICATIONS

Office Action for Taiwanese Patent Application No. 108143490 dated Jun. 15, 2020. 8 pages.

(Continued)

*Primary Examiner* — Brook Kebede
(74) *Attorney, Agent, or Firm* — Lerner, David, Littenberg, Krumholz & Mentlik, LLP

(57) ABSTRACT

A device for direct liquid cooling is disclosed. The device includes a packaged assembly disposed on a substrate. The device also includes a metal channel layer having a plurality of channels disposed on top of the packaged assembly, and a top seal disposed on the metal channel layer. The top seal has at least one inlet and at least one outlet for direct liquid cooling. The metal channel layer includes copper or silver. The packaged assembly can also include silicon channels. In addition, the method of producing the device is also disclosed.

31 Claims, 10 Drawing Sheets

(51) Int. Cl.
*H01L 23/532* (2006.01)
*H05K 7/20* (2006.01)

(56) References Cited

U.S. PATENT DOCUMENTS

| | | | |
|---|---|---|---|
| 6,351,384 B1* | 2/2002 | Daikoku | F28F 3/02 |
| | | | 165/80.3 |
| 2004/0190254 A1* | 9/2004 | Hu | H01L 23/473 |
| | | | 361/699 |
| 2005/0141195 A1* | 6/2005 | Pokharna | F28F 3/025 |
| | | | 361/699 |
| 2006/0285300 A1 | 12/2006 | Brandenburg et al. | |
| 2007/0258213 A1* | 11/2007 | Chen | F28D 15/0233 |
| | | | 361/701 |
| 2014/0048951 A1 | 2/2014 | Lin et al. | |
| 2014/0204534 A1 | 7/2014 | Choudhury et al. | |
| 2017/0196120 A1 | 7/2017 | Oprins et al. | |
| 2018/0090417 A1 | 3/2018 | Gutala et al. | |
| 2018/0211900 A1 | 7/2018 | Gutala et al. | |
| 2018/0294205 A1 | 10/2018 | Chainer et al. | |

FOREIGN PATENT DOCUMENTS

| | | |
|---|---|---|
| EP | 1628344 A2 | 2/2006 |
| WO | 2012005706 A1 | 1/2012 |

OTHER PUBLICATIONS

Sarvey, Thomas E. et al., "Monolithic Integration of a Micropin-Fin Heat Sink in a 28-nm FPGA", IEEE Transactions on Components, Packaging and Manufacturing Technology, vol. 7, No. 10, Oct. 2017, p. 1617-1623.

International Search Report and Written Opinion for International Application No. PCT/US2019/060946 dated Feb. 24, 2020. 16 pages.

* cited by examiner

DEVICE AND METHOD FOR DIRECT LIQUID COOLING VIA METAL CHANNELS

BACKGROUND

Thermal management in silicon chips having advanced integrated circuits is a rising challenge for high performance applications. Traditional approaches using high thermal conductive materials have limited cooling capability because the approaches rely on interface contact for heat dissipation. To promote faster heat dissipation, liquid cooling can be used in certain applications and various approaches based on liquid cooling techniques are being explored in the industry.

SUMMARY

At least one aspect is directed to a device for direct liquid cooling. The device includes a packaged assembly disposed on a substrate. The device also includes a metal channel layer disposed on top of the packaged assembly. The metal channel layer has a plurality of channels formed into its surface for conducting fluid through the channels. The device also includes a top seal disposed on the metal channel layer. The top seal has at least one inlet positioned to introduce a cooling liquid into the channels and at least one outlet positioned to allow outflow of the cooling liquid out of the channels.

In some implementations, the device also includes a stiffener member disposed on the substrate. In some implementations, the device also includes epoxy disposed between an outer edge of the packaged assembly and an inner portion of the stiffener member.

In some implementations of the device, top surfaces of the packaged assembly, the epoxy, and the stiffener member are planarized to form a uniform surface. In some implementations, the stiffener member is taller than the packaged assembly. In some implementations, the stiffener member is shorter than the packaged assembly. In some implementations, the device includes a pump coupled to the at least one inlet and the at least one outlet, the pump configured to pump fluid in via the at least one inlet, through the plurality of channels in the metal channel layer, and out via the at least one outlet.

In some implementations, the metal channel layer in the device comprises copper or silver. In some implementations, at least a portion of the plurality of channels of the metal channel layer are free of a metal floor exposing a portion of the packaged assembly at the bottom of the channels so as to provide a cooling liquid a direct contact with a top surface of the packaged assembly.

In some implementations, the packaged assembly comprises a plurality of silicon channels in addition to the plurality of the channels in the metal channel layer.

In some implementations, the device includes multiple, fluidically separated channels in the metal channel layer and multiple inlets and multiple outlets in the top seal for zone cooling of the packaged assembly.

In some implementations, the plurality of channels of the metal channel layer have a height to width aspect ratio between about 1:10 to about 10:1. In some implementations, the metal channel layer has a thickness from about 10 μm to about 500 μm. In some implementations, the metal channel layer has a pitch between the plurality of channels between about 1 μm to about 500 μm.

In some implementations, the packaged assembly comprises at least one of a processor or a memory module.

At least one aspect is directed to a method of producing a device for direct liquid cooling. The method includes providing a packaged assembly disposed on a substrate. The method also includes disposing a metal seed layer on top of the packaged assembly. The method also includes producing a metal channel layer with a plurality of channels formed into its surface. In some implementations, the method further includes disposing a top seal having at least one inlet and at least one outlet on the metal channel layer.

In some implementations, the method further includes coupling a pump to the at least one inlet and the at least one outlet. The pump is configured to pump fluid in via the at least one inlet, through the plurality of channels in the metal channel layer, and out via the at least one outlet.

In some implementations, prior to disposing the metal seed layer on top of the packaged assembly, the method further includes disposing a stiffener member on the substrate and disposing epoxy between the packaged assembly and the stiffener member. In some implementations, the epoxy is in contact with an outer edge of the packaged assembly and an inner portion of the stiffener member. In some implementations, the method includes planarizing top surfaces of the packaged assembly, the epoxy, and the stiffener member. In some implementations, the planarized top surfaces have a uniform height across the packaged assembly, the epoxy, and the stiffener member with respect to the substrate.

In some implementations, disposing the metal channel layer includes deposition via one of physical vapor deposition, chemical vapor deposition, or electroplating on the metal seed layer. In some implementations, the method further includes etching the metal seed layer so as to completely remove the metal seed layer at the plurality of channels.

In some implementations, a portion of the packaged assembly includes silicon and the method further includes etching the silicon in the portion of the packaged assembly to form a plurality of silicon channels in fluid communication with the plurality of channels in the metal channel layer.

In some implementations of the method, the device includes multiple, fluidically separated channels in the metal channel layer and multiple inlets and multiple outlets in the top seal for zone cooling of the packaged assembly.

In some implementations of the method, the metal seed layer has a thickness from about 10 nm to about 50 μm and the metal channel layer has a thickness from about 10 μm to about 500 μm. In some implementations of the method, the metal channel layer comprises copper or silver. In some implementations of the method, the plurality of channels have a height to width aspect ratio between about 1:10 to about 10:1.

In some implementations, disposing the metal seed layer on top of the packaged assembly includes disposing the metal seed layer on top of a plurality of packaged assemblies including the packaged assembly arranged on a wafer. In some implementations, the method further includes singulating the wafer to obtain the packaged assembly for disposing on the substrate. In some implementations, the metal seed layer is disposed on top of the packaged assembly before the packaged assembly is disposed on the substrate. In some implementations, the method further includes applying an epoxy between the packaged assembly disposed on the substrate and a stiffener surrounding the packaged assembly on the substrate, and applying a metal sealant layer on top of the applied epoxy. In some implementations, the metal seed layer is disposed on top of the packaged assembly after the packaged assembly is disposed on the substrate.

At least one aspect is directed to a system for direct liquid cooling. The device includes a packaged assembly disposed on a substrate. The device also includes a metal channel layer having a plurality of channels disposed on top of the packaged assembly. The device also includes a top seal disposed on the metal channel layer. In some implementations of the device, the top seal has at least one inlet and at least one outlet. In some implementations of the device, a pump is configured to pump a liquid into the channels via the at least one inlet, through the plurality of channels, and out of the channels via the at least one outlet.

In some implementations of the device, the metal channel layer comprises copper or silver. In some implementations of the device, the plurality of channels have a height to width ratio between about 1:10 to about 10:1.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1A:
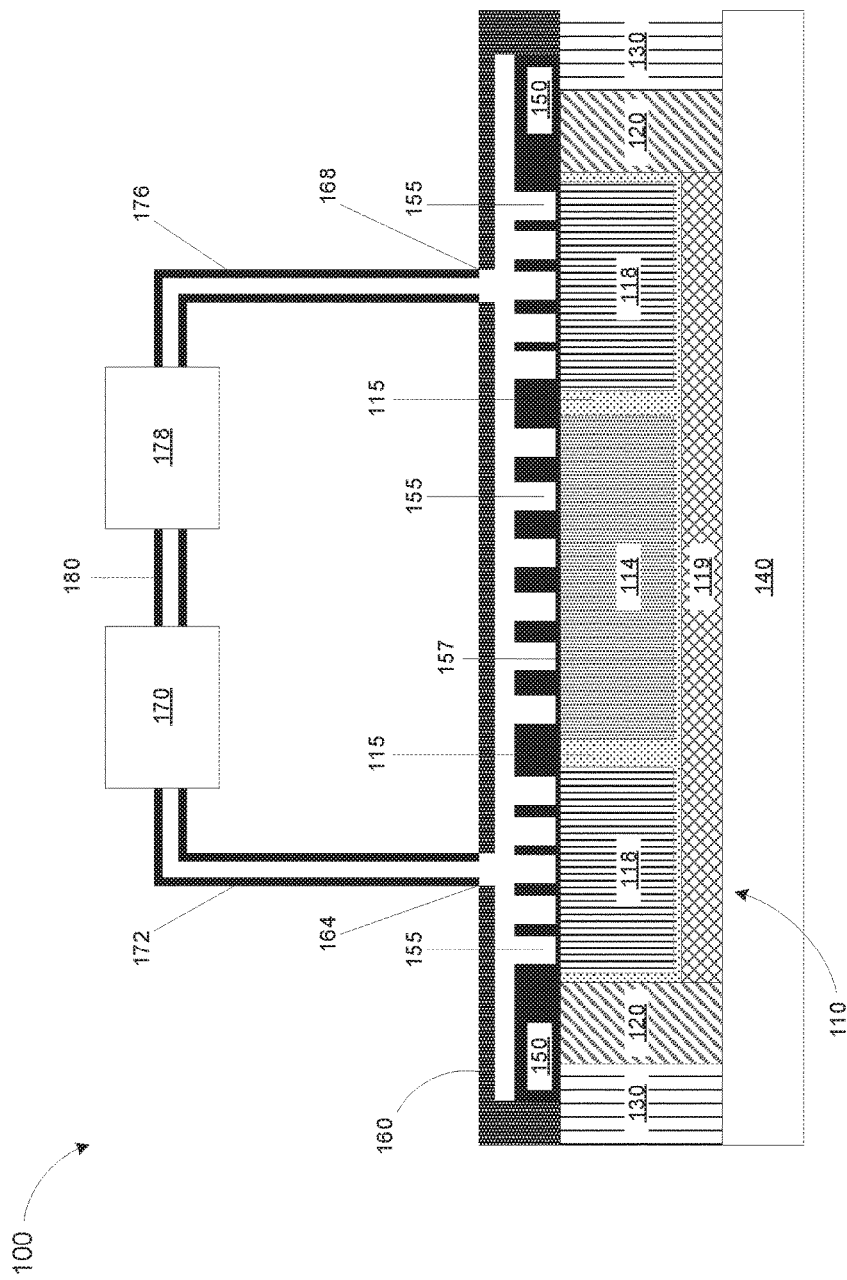
FIG. 1A shows an implementation of a device for direct liquid cooling of a packaged integrated circuit, according to an illustrative implementation.

The disclosure as described herein relates to a device for direct liquid cooling of a packaged assembly containing an integrated circuit and a method for producing the same. Various implementations of the device disclosed herein employ a metal layer containing channels coupled to a surface of the packaged integrated circuit for direct liquid cooling of the integrated circuit. The various implementations discussed herein include various configurations for cooling an integrated circuit, such as a high performing processing core and/or a memory module. Depending on the cooling needs of a particular packaged assembly or chip, the metal layer can include channels of different aspect ratios, depths, and/or materials. In some implementations of the device, the channels can be in direct contact with the packaged assembly containing a high power or high heat-generating source. In some implementations of the device, the channels can also be built into the packaged assembly containing the high power or high heat-generating source.

In various implementations of the device disclosed herein, an advantageous combination of direct physical contact to the source of heat and accelerated heat removal via a cooling liquid circulating in the channels adjacent to the heat source results in enhanced heat dissipation. The various implementations of the device can be produced using fabrication technologies that are widely available in conjunction with current manufacturing equipment and processes, such as silicon backside metallization and copper plating.

In various implementations, the device includes a packaged assembly disposed on a substrate. The device also includes a stiffener member or stiffener ring disposed on the substrate. The device also includes epoxy disposed between an outer edge of the packaged assembly and an inner portion of the stiffener member. The device also includes a metal channel layer having a plurality of channels patterned into its surface, and which is disposed on top of the packaged assembly, the epoxy, and the stiffener member. The device also includes a top seal disposed on the metal channel layer. The top seal has at least one inlet and at least one outlet.

In some implementations of the device, the packaged assembly includes an integrated circuit with exposed silicon. In some implementations, a portion of the packaged assembly includes gallium arsenide (GaAs), silicon carbide (SiC) or another semiconductor material. Silicon is used as an example implementation herein for discussion and illustrative purposes, and is therefore non-limiting and thus, any other suitable configurations of the packaged assembly with other semiconductor materials, including GaAs and SiC are applicable. In some implementations of the device, a metal layer is disposed on the exposed silicon. In some implementations, the metal layer includes copper. The copper channels in direct contact with silicon provides a much larger total surface area for heat dissipation. A cooling liquid running through these copper (or any suitable metal or alloy) channels can extract heat directly from silicon as well as the walls of the copper channels.

In some implementations of the device, the exposed silicon includes channels. The silicon channels can provide additional surface areas for the liquid cooling. In some implementations of the device, the silicon channels in combination of the metal channels may provide enhanced heat dissipation. However, depending on the cooling application and requirements, liquid cooling via only the silicon channels (without metal channels) may not be advantageous. In some instances, etching deep silicon channels in the silicon die of the integrated circuit may cause thinning of the silicon and cause stress in the silicon that can create unnecessary risks associated with weakening of the structural integrity of the integrated circuit and the packaged assembly. In addition, since the silicon die has a thickness limitation, the thickness of the silicon channels is limited. In contrast, the metal, such as copper, can be deposited or plated on top of the silicon with less stringent thickness limitations. Consequently, there is less limitation on the depth of the channels that are built within the deposited or plated metal layer.

In some implementations of the device, a mold is used to hold the integrated circuit die included in the packaged assembly. In some implementations, the mold material can be covered with the deposited or plated metal layer that helps create a metal seal over the mold. Typical mold materials used in semiconductor packaging are sensitive to moisture. The metal layer can prevent moisture from the cooling liquid from coming into contact with the mold materials.

The following figures and descriptions with respect to the figures provide additional details of the various implementations of the device and the methods for producing the same.

FIG. 1A shows an implementation of a device 100 for direct liquid cooling of a packaged integrated circuit, according to an illustrative implementation. The device 100 includes a packaged assembly 110, epoxy 120, and a stiffener member 130 disposed on a substrate 140. In some implementations, the epoxy 120 is disposed between an outer edge of the packaged assembly 110 and an inner portion of the stiffener member 130. As shown in FIG. 1A, the packaged assembly 110 is held by the epoxy 120 to the stiffener member 130 and all are disposed on the substrate 140.

In some implementations, the packaged assembly 110 comprises at least one integrated circuit 114 and/or a memory module 118 disposed within a mold material 115 on an interposer 119. The integrated circuit 114 can be a processor, such as a microprocessor, an Application Specific Integrated Circuit (ASIC), field programmable gate array (FPGA), digital signal processor (DSP), or any other type of processor or integrated circuit. The mold material 115 acts as a structure for holding in place the components, such as the integrated circuit 114 and the memory modules 118. In some implementations, the packaged assembly 110 can include other components in addition to the integrated circuit 114 and the memory module 118. In some implementations, the integrated circuit 114 and/or the memory module 118 are held within the mold material 115 in a way to ensure that top surfaces of the integrated circuit 114 and/or the memory module 118 are leveled and flushed against the mold material 115 so that the top surface of the packaged assembly 110 as a whole has a leveled or even surface. This flushed, leveled or even surface allows for direct contact with a surface of an apparatus used for direct liquid cooling of the components in the packaged assembly 110.

The epoxy 120 included in the device 100 can be any epoxy suitable for high temperature applications for filling gaps between components and to reliably handle the stresses due to material inhomogeneity. In some implementations of the device 100, the epoxy 120 is any suitable epoxy material that is dispensable and meet the reliability requirements In some implementations of the device 100, the stiffener member 130 includes copper, steel or any suitable metal and/or alloy.

Figure 1B:
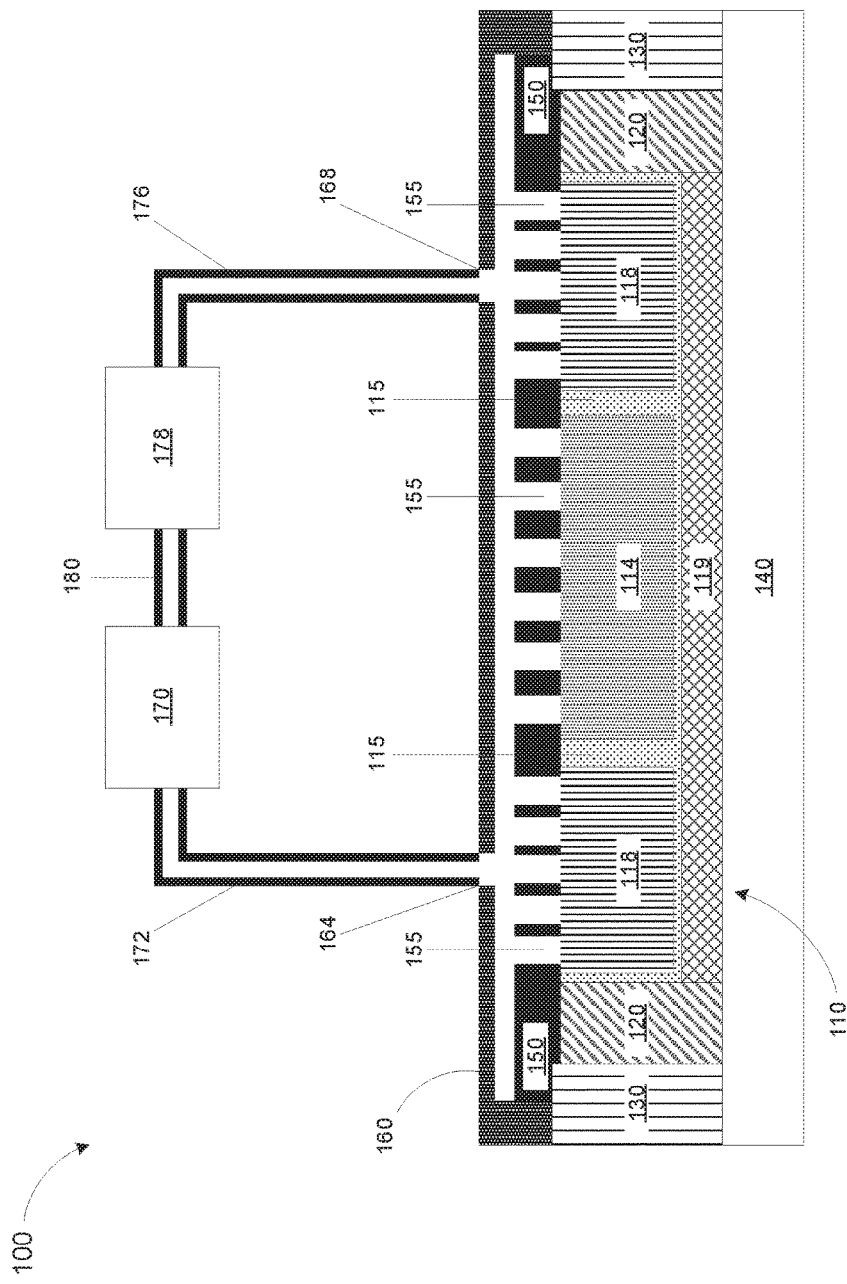
FIG. 1B shows an implementation of a device for direct liquid cooling of a packaged integrated circuit, according to an illustrative implementation.

The device 100 also includes a metal channel layer 150 having a plurality of channels 155 patterned or formed into its surface (also referred to herein as a patterned metal layer 150). In some implementations, the metal channel layer 150 has a plurality of pillars or posts patterned or formed into its surface. In some implementations, the metal channel layer 150 is disposed directly on top of the packaged assembly 110, the epoxy 120, and the stiffener member 130. In some implementations, the metal channel layer 150 is disposed on a seed layer (also referred to herein as a bottom layer 157) that is in direct contact with top surfaces of the packaged assembly 110, the epoxy 120, and the stiffener member 130. In some implementations of the device 100, top surfaces of the packaged assembly 110, the epoxy 120, and the stiffener member 130 are planarized to form a uniform surface. In some implementations of the device 100, top surfaces of the packaged assembly 110, the epoxy 120, and the stiffener member 130 are substantially leveled or have substantially the same height. In some implementations, the stiffener member 130 is taller than the packaged assembly 110 as shown in FIG. 1B. In some implementations, the stiffener member 130 is shorter than the packaged assembly 110.

In some implementations, the metal channel layer 150 in the device 100 includes copper. In some implementations, the metal channel layer 150 in the device 100 includes aluminum, silver or any high thermal conducting materials, including metal, metal alloy or suitable non-metal or non-alloy high thermal conducting materials.

In some implementations, the metal channel layer 150 has a thickness from about 10 µm to about 500 µm. In some implementations, the metal channel layer 150 has a thickness from about 50 µm to about 500 µm, about 50 µm to about 400 µm, about 50 µm to about 300 µm, about 50 µm to about 200 µm, or about 100 µm to about 300 µm, inclusive of any thicknesses therebetween. In some implementations, some portions of the metal channel layer 150 has a thickness that is different from other portions of the metal channel layer 150.

In some implementations, the plurality of channels 155 in the metal channel layer 150 have a height that is the same or substantially the same as the thickness of the metal channel layer 150. In other words, the plurality of channels 155 in the metal channel layer 150 have a height that is from about 10 µm to about 500 µm. In some implementations, the plurality of channels 155 of the metal channel layer 150 have a height that is from about 10% to about 95% of the thickness of the metal channel layer 150. In some implementations, the plurality of channels 155 of the metal channel layer 150 have a height that is from about 30% to about 90%, about 50% to about 90%, or about 70% to about 90%, of the thickness of the metal channel layer 150. In some implementations, since some portions of the metal channel layer 150 have a different thickness than other portions of the metal channel layer 150, i.e., some of the plurality of channels 155 in the metal channel layer 150 may have different heights across the metal channel layer 150.

In some implementations, the plurality of channels 155 in the metal channel layer 150 have a width that is from about 10% to about 1000% of the thickness of the metal channel layer 150. In other words, the plurality of channels 155 in the metal channel layer 150 have a width that is from about 1 µm to about 5 mm.

In some implementations, the width of the plurality of channels 155 can be described with respect to the height of the plurality of channels 155 in terms of aspect ratios. In some implementations, the plurality of channels 155 in the metal channel layer 150 have a height to width aspect ratio between about 1:10 to about 10:1. In some implementations, the height to width aspect ratio between the height and the width of the plurality of channels 155 is from about 1:8 to about 8:1, from about 1:5 to about 5:1, from about 1:5 to about 10:1, from about 1:1 to about 10:1, from about 1:1 to about 5:1, from about 1:3 to about 10:1, or from about 3:1 to about 7:1, inclusive of any ratios therebetween. In some implementations, the aspect ratios vary across the plurality of channels 155 in the metal channel layer 150.

In some implementations, the plurality of channels 155 in the metal channel layer 150 have a pitch between the channels 155 from about 1 µm to about 500 µm. In some implementations, the metal channel layer 150 has a pitch between the channels 155 from about 20 µm to about 400 µm, about 50 µm to about 300 µm, about 10 µm to about 100 µm, about 5 µm to about 20 µm, or about 10 µm to about 30 µm, inclusive of any pitch values therebetween. In some implementations, the pitch can vary across the metal channel layer 150 where one area of the metal channel layer 150 can have a specific pitch between the channels 155 while other areas have different pitches between the channels 155.

In some implementations, the plurality of channels 155 in the metal channel layer 150 have a bottom layer 157 that is in contact with a top surface of at least one of the packaged assembly 110, the epoxy 120, or the stiffener member 130. In some implementations, the bottom layer 157 is deposited via at least one of physical vapor deposition technique, chemical vapor deposition technique, sputtering, electroplating, or any suitable deposition technique to deposit a thin metal or alloy film. In some implementations, the bottom layer 157 is a multilayer composite. In some implementations, the bottom layer 157 is a seed layer that can be used to electroplate the metal channel layer 150. In some implementations, the bottom layer 157 includes at least one of copper, titanium, silver, or tungsten.

In some implementations, the bottom layer 157 has a thickness from about 10 nm to about 50 µm. In some implementations, the bottom layer 157 has a thickness from about 20 nm to about 10 µm, about 30 nm to about 1 µm, about 40 nm to about 500 nm, about 50 nm to about 200 nm, about 60 nm to about 100 nm, inclusive of any thicknesses therebetween.

The device 100 also includes a top seal 160 to provide a seal for liquid cooling of the packaged integrated circuit. In some implementations, the top seal 160 has an inlet 164 and an outlet 168. According to some implementations of the device 100, the inlet 164 is coupled to a pump 170 via a tubing 172 and the outlet 168 is coupled to a liquid reservoir via a tubing 176. The pump 170 can also be connected to the reservoir 178 via a tubing 180. The pump 170 is configured to pump a cooling liquid from the reservoir 178 into the inlet 164, flow the liquid through the plurality of channels 155 in the metal channel layer 150, and pump the liquid out from the outlet 168 into the fluid reservoir 178.

In some implementations, the top seal 160 can include a plurality of inlets 164 and a plurality of outlets 168. In some implementations, the plurality of inlets 164 and the plurality of outlets 168 can be coupled to the pump 170 to provide multiple cooling zones (as described in detail below with respect to FIG. 3) of a single device 100. In some implementations, a single pump 170 can be coupled to multiple devices 100.

In some implementations of the device 100, the liquid for direct liquid cooling includes at least one of water, glycol, dielectric fluids, etc.

In some implementations of the device 100, the top seal 160 includes copper, aluminum, steel, or any other suitable metal and/or alloy.

In some implementations, a liquid for direct liquid cooling can be pumped in via the inlet 164, circulated to flow through the plurality of channels 155, and pumped out via the outlet 168. In some implementations, a liquid for direct liquid cooling can be pumped in via one or more inlets 164 and pumped out via one or more outlets 168. In some implementations, the pump 170 pumps in a cooling liquid into the inlet 164, flow the cooling liquid through the plurality of channels 155 in the metal channel layer 150, and pump out the warm liquid from the outlet 168 into the fluid reservoir 178 to cool the warm liquid. In doing so, the direct cooling can enhance heat dissipation from the packaged integrated circuit. According to some implementations, the device 100 can effectively reduce a temperature of the packaged assembly by at least about 1° C., by at least about 5° C., by at least about 10° C., by at least about 20° C., by at least about 30° C., by at least about 40° C., or by at least about 50° C.

As stated above, in some implementations, the device 100 also includes the top seal 160 disposed on the metal channel layer 150 to provide a proper seal for the cooling liquid and to prevent liquid loss from leaks. In some implementations, the roof of the top seal 160 is at least about 1 mm above the metal channel layer 150. In some implementations, the roof of the top seal 160 is from about 100 µm to about 3 mm above the metal channel layer 150. In some implementations, the roof of the top seal 160 is from about 200 µm to about 2 mm, about 300 µm to about 1 mm, or about 400 µm to about 800 µm, above the metal channel layer 150.

FIG. 1B shows another implementation of the device 100 for direct liquid cooling of a packaged integrated circuit, according to an illustrative implementation. As shown in FIG. 1B, the device 100 includes the plurality of channels 155 of the metal channel layer 150 that are free of a bottom layer 157, e.g. the seed layer, which in some implementations of the device 100, is used to form a portion of the metal channel layer 150. In other words, the plurality of channels 155 of the metal channel layer 150 do not include the bottom portion (e.g., the seed layer) that makes up the bottom layer 157 so that the top surface of the packaged assembly 110 is exposed to the cooling liquid that is being circulated through the plurality of channels 155. In some implementations, this direct exposure to the cooling liquid enables enhanced heat dissipation of the integrated circuit 114 of the packaged assembly 110. In such implementations, though, preferably any materials susceptible to corrosion damage, swelling, or reaction to moisture remain covered and sealed by the metal channel layer 150.

As shown in FIG. 1B, the stiffener member 130 is taller than the packaged assembly 110. In other implementations of the device 100, top surfaces of the packaged assembly 110, the epoxy 120, and the stiffener member 130 have the same height as shown in FIG. 1A.

Figure 1C:
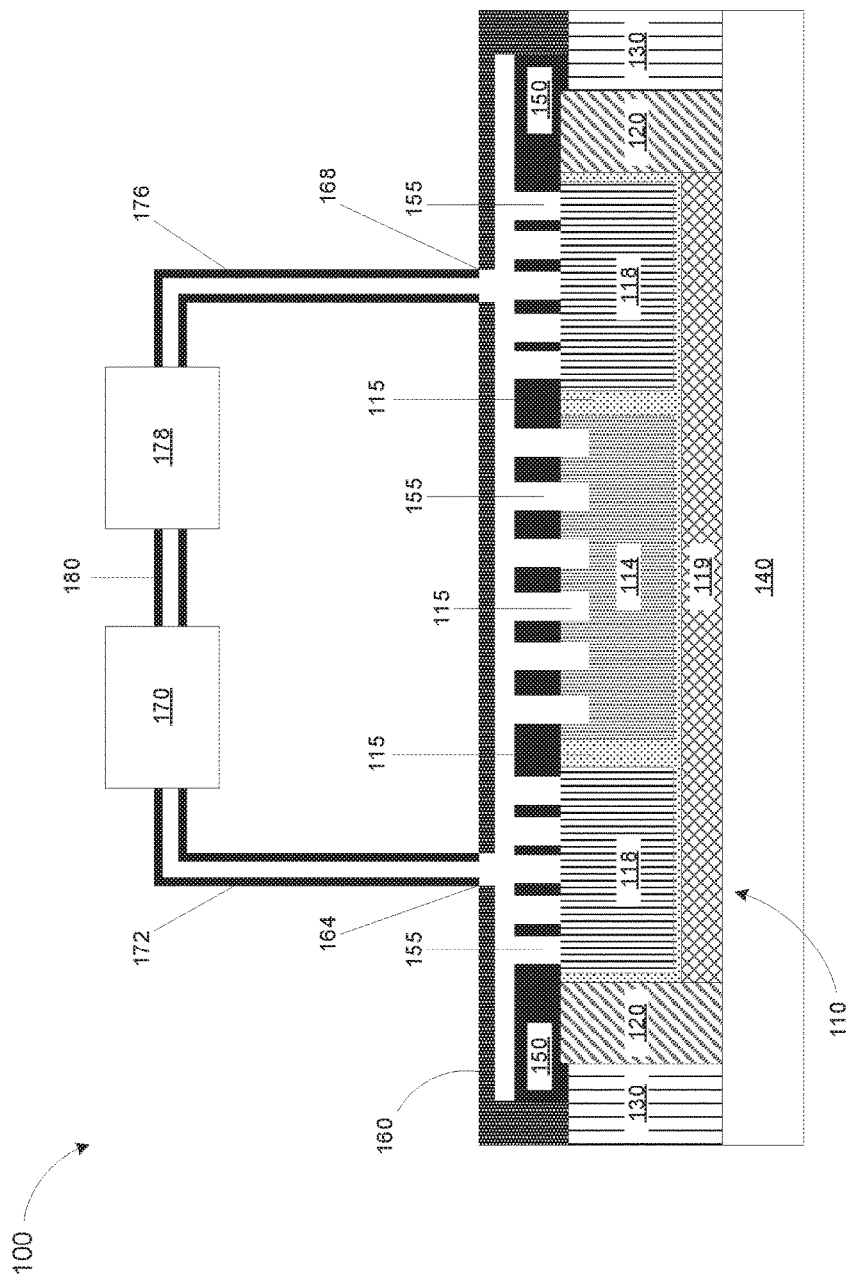
FIG. 1C shows an implementation of a device for direct liquid cooling of a packaged integrated circuit, according to an illustrative implementation.

FIG. 1C shows another implementation of the device 100 for direct liquid cooling of a packaged integrated circuit, according to an illustrative implementation. As shown in FIG. 1C, the stiffener member 130 is shorter than the packaged assembly 110. The packaged assembly 110 of the device 100 itself includes a plurality of silicon channels 115. In some implementations, the integrated circuit 114 of the packaged assembly 110 includes a plurality of silicon channels 115 built into a silicon portion (or silicon die) of the integrated circuit 114. Similar to the implementations shown with respect to FIG. 1B, the additional or direct exposure to the cooling liquid in the plurality of silicon channels 115 can enable enhanced heat dissipation of the integrated circuit 114 of the packaged assembly 110. In some implementations, the plurality of silicon channels 115 align substantially with the plurality of channels 155 of the metal channel layer 150.

In some implementations, the plurality of silicon channels 115 have a width that is the same or substantially the same as the width of the plurality of channels 155. In some implementations, the plurality of silicon channels 115 have a height (can also be referred to as trench depth) that is from about 5% to about 95% of the height of the plurality of channels 155. In some implementations, the plurality of silicon channels 115 have a height (or trench depth) that is from about 10% to about 80%, about 20% to about 70%, or about 30% to about 60%, or about 10% to about 30%, of the height of the plurality of channels 155.

In some implementations, the plurality of silicon channels 115 in the silicon portion of the integrated circuit 114 have an aspect ratio between a height and a width from about 1:10 to about 10:1. In some implementations, the aspect ratio between the height and the width of the plurality of silicon channels 115 is from about 1:8 to about 8:1, from about 1:5 to about 5:1, from about 1:5 to about 10:1, from about 1:1 to about 10:1, from about 1:1 to about 5:1, from about 1:3 to about 10:1, or from about 3:1 to about 7:1, inclusive of any ratios therebetween.

Figure 1D:
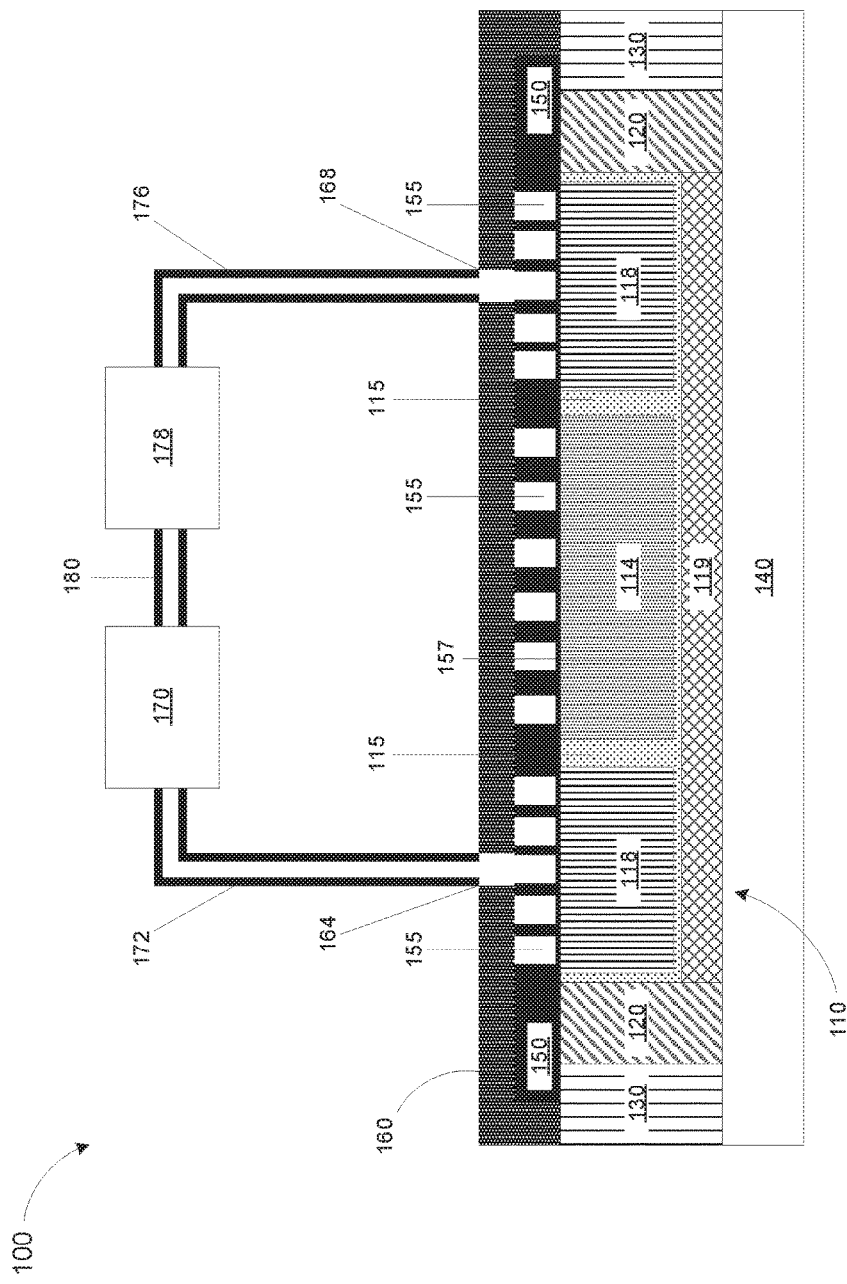
FIG. 1D shows an implementation of a device for direct liquid cooling of a packaged integrated circuit, according to an illustrative implementation.

FIG. 1D shows another implementation of the device 100 for direct liquid cooling of a packaged integrated circuit, according to an illustrative implementation. The implementation shown in FIG. 1D includes the top seal 160 that is in direct contact with the metal channel layer 150. In other words, FIG. 1D highlights that the plurality of the channels 155 are covered in a way that the liquid flows within the channels 155, as opposed to potentially overflowing the tops of the channels 155. The direct contact between the top seal 160 and the metal channel layer 150 can be implemented with any of the implementations and features shown with respect to FIGS. 1A, 1B and 1C.

Figure 2B:
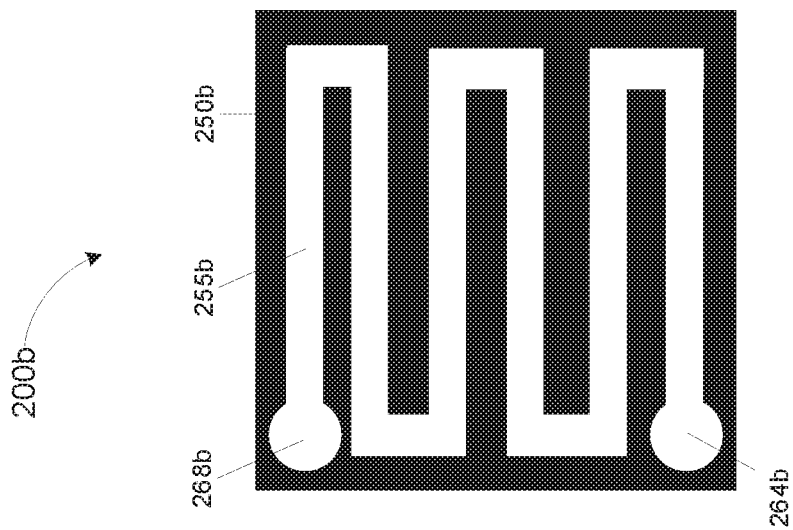
FIGS. 2A, 2B, 2C, and 2D are schematic top view illustrations of various example implementations of a metal channel layer for direct liquid cooling, according to illustrative implementations.
Figure 2A:
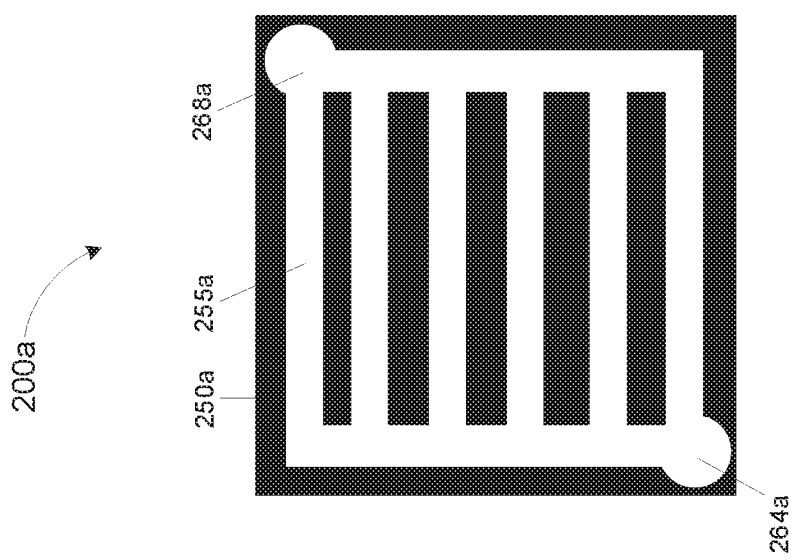

FIGS. 2A, 2B, 2C, and 2D are schematic top view illustrations of various example implementations of a metal channel layer for direct liquid cooling, according to illustrative implementations. The illustrations depicted in FIGS. 2A, 2B, 2C, and 2D are example implementations included herein for discussion and illustrative purposes, and are therefore non-limiting, and any other suitable configurations are applicable for direct liquid cooling. FIG. 2A is a schematic illustration 200a that shows a metal channel layer 250a having a plurality of channels 255a formed into its surface. The schematic illustration 200a also shows the position of an inlet 264a for cooling liquid intake and the position of an outlet 268a for liquid outtake. Since the inlet 264a and the outlet 268a are shown in FIG. 2A as positioned diagonally across the schematic illustration 200a, there can be multiple flow paths of the cooling liquid through the plurality of channels 255a.

FIG. 2B shows another schematic illustration 200b that shows a different configuration with a metal channel layer 250b having a single channel 255b formed into its surface. The schematic illustration 200b also shows the position of an inlet 264b for cooling liquid intake and the position of an outlet 268b for liquid outtake. However, in contrast to the illustration 200a, the inlet 264b and the outlet 268b are connected on the opposite ends of the channel 255b that meanders through the metal channel layer 250b to ensure that the cooling liquid flows from the inlet 264b to the outlet 268b.

Figure 2D:
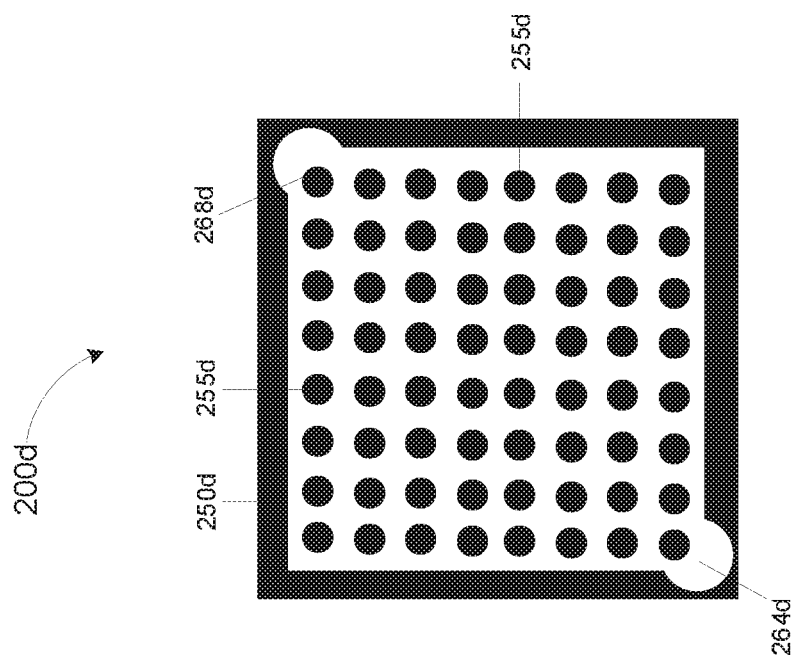
Figure 2C:
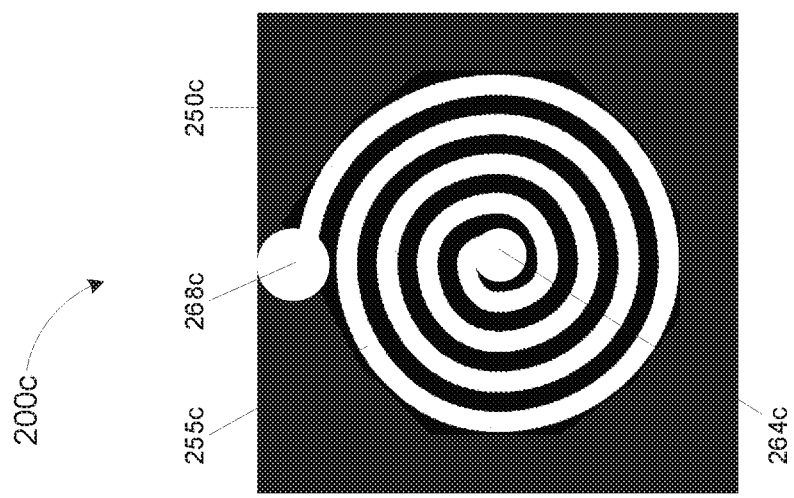

FIG. 2C shows yet another schematic illustration 200c that shows another configuration with a metal channel layer 250c having a single channel 255c formed into its surface. The schematic illustration 200c also shows an inlet 264c which resides in the center portion for cooling liquid intake and an outlet 268c disposed on the outer area for liquid outtake. However, in contrast to the illustration 200a, the inlet 264c and the outlet 268c are connected on the opposite ends of the channel 255c to ensure that the cooling liquid flows from the center portion/the inlet 264b to the outer portion/outlet 268b. Unlike the illustration 200b, which shows a meandering channel 255b with straight channel portions, the channel 255c shows a spiral or curvy channel 255c to guide the cooling liquid to flow outward from the center portion. In some implementations, this configuration can enable enhanced heat dissipation if the most energy intensive portion of the integrated circuit resides in the center portion. In other implementations, the direction of fluid flow through the channels 255a, 255b, and 255c can be reversed with outlets serving as inlets, and vice versa.

FIG. 2D shows another schematic illustration 200d that shows a metal channel layer 250d having a plurality of pillars or posts 255d formed into its surface. The schematic illustration 200d also shows the position of an inlet 264d for cooling liquid intake and the position of an outlet 268d for liquid outtake. Since the inlet 264d and the outlet 268d are shown in FIG. 2D as positioned diagonally across the schematic illustration 200d, there can be multiple flow paths of the cooling liquid through the plurality of pillars or posts 255d. In some implementations, the plurality of pillars or posts 255d can be formed in an array. In some implementations, the plurality of pillars or posts 255d can be formed in any geometrical shape or form, including circle, oval, square or any polygon shape when viewed in top view illustrations. In some implementations, the plurality of pillars or posts 255d can be straight or slanted in the vertical direction. In some implementations, the plurality of pillars or posts 255d can be in any geometrical shape or form to effectively direct the liquid flow for enhanced liquid cooling.

Figure 3:
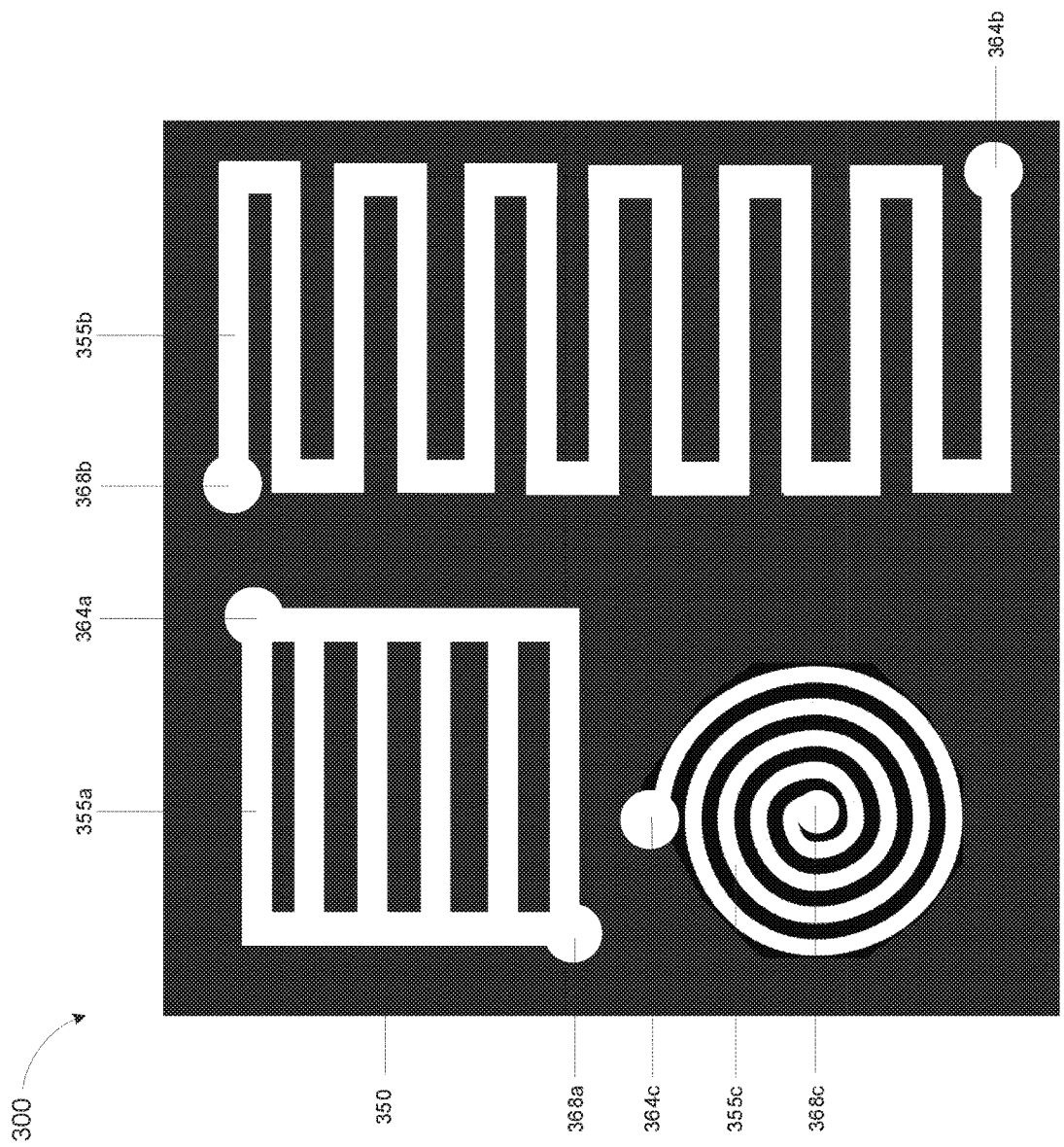
FIG. 3 is another schematic top view illustration of an example implementation of a metal channel layer for direct liquid cooling, according to illustrative implementations.

FIG. 3 is a schematic top view illustration 300 of an example implementation of a metal channel layer for direct liquid cooling, according to illustrative implementations. The illustration 300 shows a metal channel layer 350 having multiple channels 355a, 355b, and 355c formed into its surface. The illustration 300 also shows positions of multiple inlets 364a, 364b, and 364c for cooling liquid intake and positions of multiple outlets 368a, 368b, and 368c for liquid outtake. The multiple inlets, outlets and channels depicted in FIG. 3 are for discussion and illustrative purposes, and are therefore non-limiting, and any other suitable configurations can be included in FIG. 3 are applicable for direct liquid cooling. In some implementations, all inlets and all outlets are coupled to a pump (not shown) to pump a cooling liquid in and out of the channels for cooling the packaged integrated circuit in its entirety. In some implementations, any of the inlets and any of the outlets can be selectively coupled to a pump (not shown) so as to pump a cooling liquid in and out of the channels only in the selected portions of the packaged integrated circuit. In doing so, a portion of the packaged integrated circuit disposed under the metal channel layer 350 can be cooled while other portions of the packaged integrated circuit is not actively cooled. Alternatively, each zone may be coupled to different pumps. For example, each pump may pump a different cooling liquid having different cooling properties, or the same fluid at different temperatures. In the latter case, the reservoirs coupled to the respective pumps may each have their own controllable cooling elements and sensors. This approach enables "zone cooling" of the packaged integrated circuit disposed underneath the metal channel layer 350.

Figure 4:
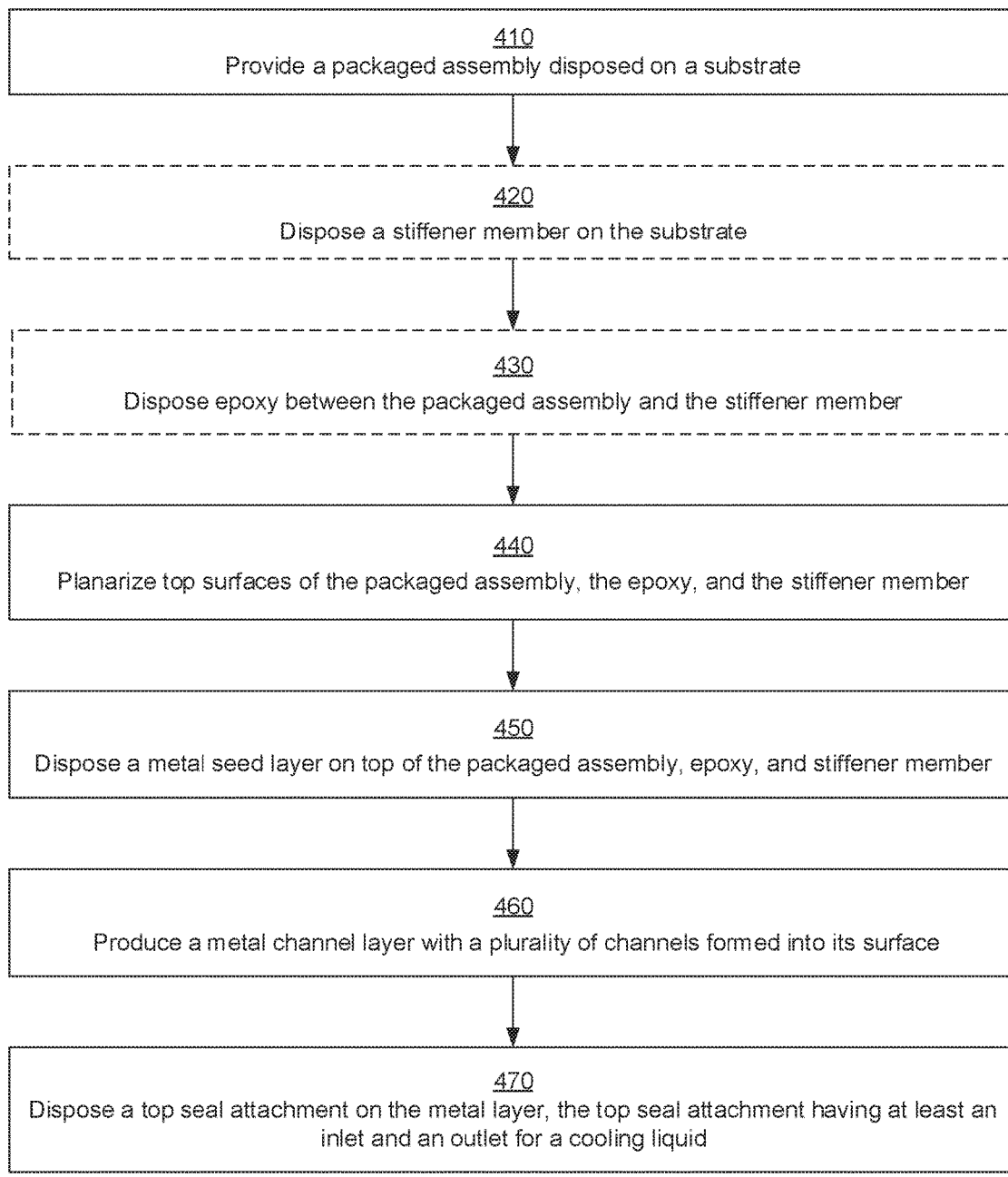
FIG. 4 is a flowchart of an example method of producing a device for direct liquid cooling of a packaged integrated circuit, according to an illustrative implementation.

FIG. 4 is a flowchart of an example method 400 for producing a device for direct liquid cooling, according to an illustrative implementation. The method 400 includes providing a packaged assembly disposed on a substrate (stage 410). In some implementations, the method 400 optionally includes disposing a stiffener member on the substrate (stage 420). In some implementations, the method 400 optionally includes disposing an epoxy between the packaged assembly and the stiffener member (stage 430). In some implementations, the method 400 includes planarizing top surfaces of the packaged assembly, the epoxy, and the stiffener member so as to form a planarized surface having a uniform height (stage 440). In alternative implementations, the planarization step may not be needed if the top surfaces of the packaged assembly, the epoxy, and the stiffener member have substantially the same height from the substrate. In some implementations, planarization is not feasible when the stiffener member is shorter or taller than the packaged assembly.

As shown in FIG. 4, the method 400 further includes disposing a metal seed layer on top surfaces of the packaged assembly, the epoxy, and the stiffener member (stage 450). In some implementations, the metal seed layer can be deposited via sputter deposition, physical vapor deposition, chemical vapor deposition, or any other suitable deposition techniques.

After disposing the metal seed layer, the method 400 includes producing a metal channel layer with a plurality of channels formed into it surface (stage 460). In some implementations, the method 400 can include using photolithography to form the outline of the plurality of channels on the metal seed layer. Once the patterns are formed, electroplating can be used to grow walls of the metal channel layer that become the channels. In alternative implementations, the method 400 may include blanket depositing a thick metal layer that will be subsequently etched to form the channels. In alternative implementations, the method 400 may include any other suitable approaches, including photolithography lift-off techniques, to produce the metal channel layer with a plurality of channels formed into its surface. In some implementations, the method 400 can include etching the metal seed layer so as to remove the metal seed layer in the channels so that the surface of the underlying packaged assembly is exposed to the cooling liquid. In alternative implementations, the method 400 includes etching the metal seed layer so as to partially remove the metal seed layer in the channels. The amount of the metal seed layer removal depends on the application and its thermal management design.

The method 400 further includes disposing a top seal on the metal layer (stage 470). In some implementations, the top seal has one or more inlets for liquid input and one or more outlets for liquid output. In some implementations, the top seal is fastened to the rest of the device to ensure a tight seal.

Figure 5:
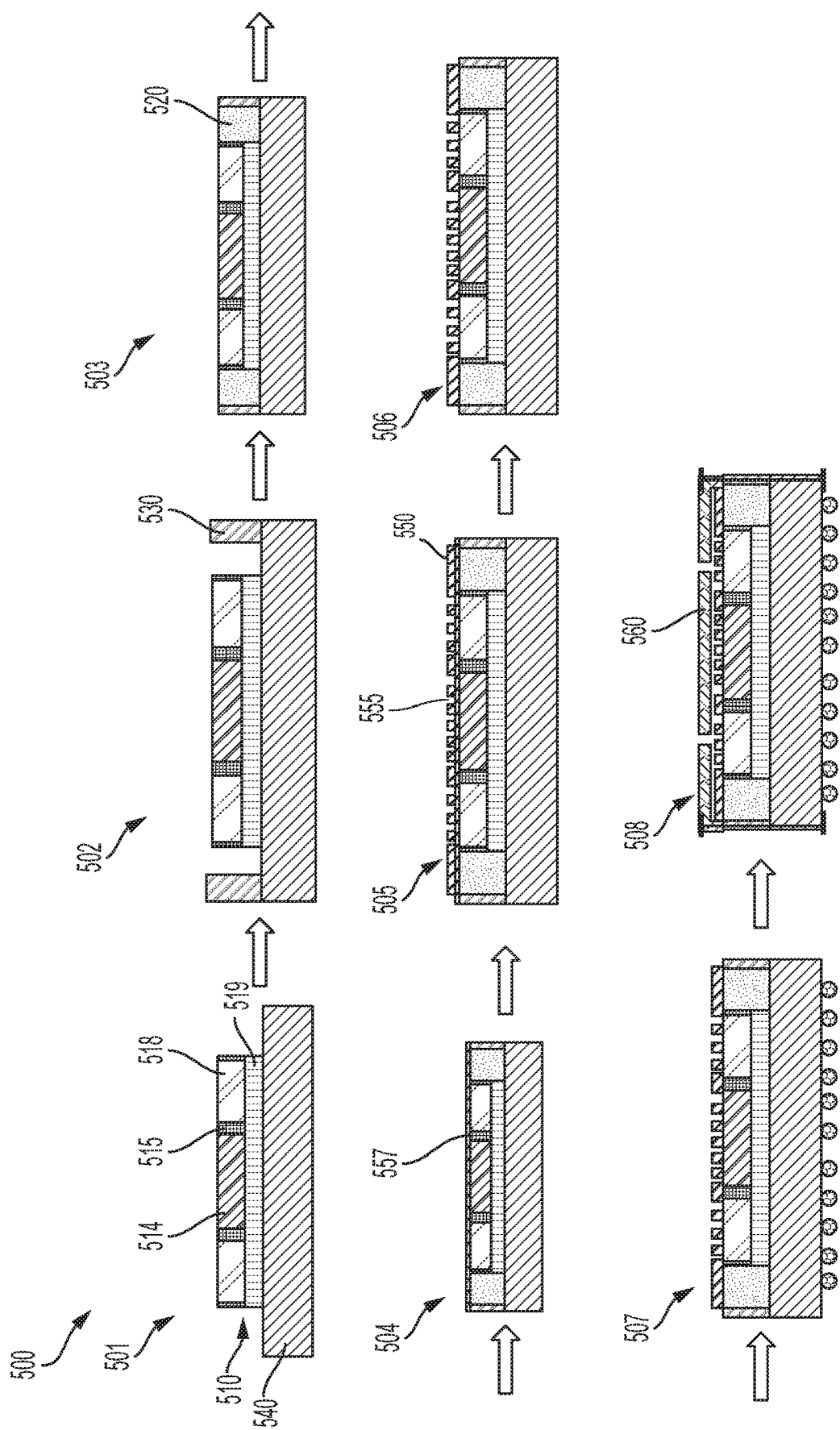
FIG. 5 shows a process flow for producing a device for direct liquid cooling, according to an illustrative implementation.

FIG. 5 shows a process flow 500 for producing a device for direct liquid cooling, according to an illustrative implementation. The process flow 500 shown in FIG. 5 illustrates progression of the assembly process in stages 501, 502, 503, 504, 505, 506, 507, and 508. For example, stage 501 shown in FIG. 5 corresponds to completion of stage 410 shown in FIG. 4 that shows a packaged assembly 510 disposed on a substrate 540. The packaged assembly 510 comprises at least one integrated circuit 514 and/or a memory module 518 disposed within a mold material 515 on an interposer 519. Similarly, stage 502 corresponds to completion of stage 420 that shows a stiffener member 530 disposed on the substrate 540. Stage 503 corresponds to completion of stage 430 that shows epoxy 520 disposed between the stiffener member 530 and the packaged assembly 510. Stage 504 corresponds to completion of stage 450 and shows a metal seed layer 557 is formed by deposition of titanium and/or copper metal seed layer. Stage 505 and stage 506 correspond to completion of stage 460 that shows forming a metal channel layer 550 with a plurality of channels 555 formed into its surface. Stage 507 shows attachment of a ball grid array allowing the packaged device to be bonded to, e.g., a printed circuit board or other substrate. Stage 508 corresponds to completion of stage 470 that shows a top seal attachment 560 disposed on the metal channel layer 550.

Figure 6:
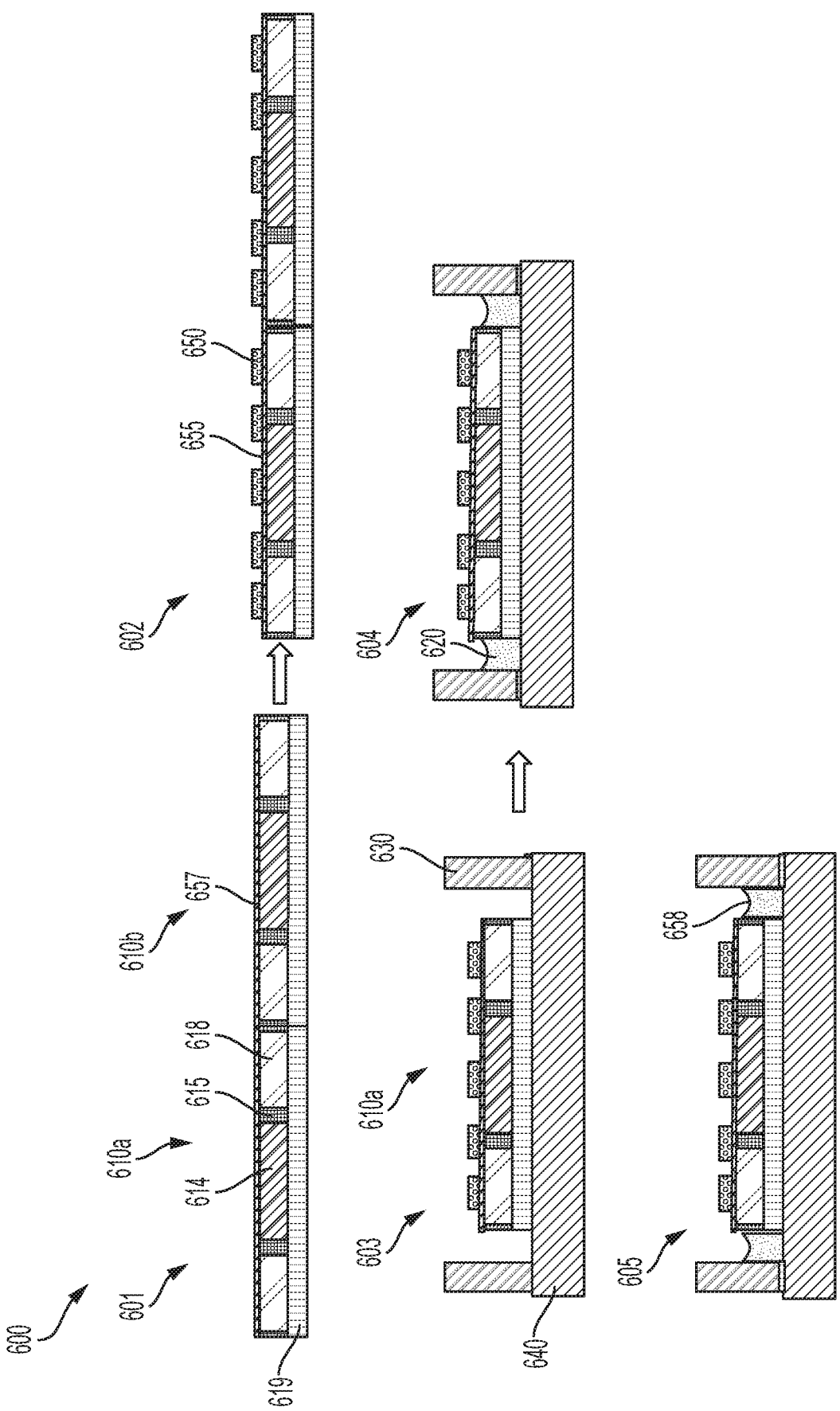
FIG. 6 shows an alternate process flow for producing a device for direct liquid cooling, according to an illustrative implementation.

FIG. 6 shows an alternate process flow 600 for producing a device for direct liquid cooling, according to an illustrative implementation. In the process flow 600, a metal channel layer is formed simultaneous across multiple packaged assemblies, which are then later singulated into separate packaged assemblies for further packaging. Stage 601 shown in the process flow 600 includes packaged assemblies 610a and 610b (collectively referred to as "packaged assemblies 610") disposed within a mold material 615 on an interposer 619. In some implementations, the packaged assemblies 610 comprise a plurality of packaged assemblies in addition to packaged assemblies 610a and 610b. Each of the packaged assemblies 610 comprises at least one integrated circuit 614 and/or a memory module 618 disposed within the mold material 615 on the interposer 619. Stage 601 of FIG. 6 shows a metal seed layer 657 disposed on the plurality of packaged assemblies 610a and 610b. For example, stage 601 corresponds to completion of stages 450 in FIG. 4, albeit with multiple packaged assemblies being processed together, instead of a single packaged assembly as shown in FIG. 5.

Stage 602 of the process flow 600 corresponds to completion of stage 460 and shows forming a metal channel layer 650 with a plurality of channels 655 formed into the surface of each of the packaged assemblies 610a and 610b. Once the metal channel layer 650 is formed, the packaged assemblies 610a and 610b are singulated (i.e., diced into two separate pieces). Stage 603 shows a singulated packaged assembly 610a and a stiffener member 630 disposed on a substrate 640. Stage 604 shows epoxy 620 disposed to fill the gaps between the stiffener member 630 and the packaged assembly 610a to cover and protect electronic components and circuits (e.g., passive circuit components, such as capacitors) that may be disposed on the substrate 640 between the stiffener 630 and the packaged assembly 610a. Stage 605 shows a thin metal layer 658 comprising titanium and/or copper to seal the mold material 615 and the epoxy 620 for moisture protection. In some implementations, the thin metal layer 658 has a thickness between 10 nm to 500 nm, and can be deposited, for example, using a sputter process. A top seal can then be added, as shown in stage 508 of FIG. 5.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A device comprising:
a packaged assembly disposed on a substrate;
a metal channel layer disposed directly on top of the packaged assembly, wherein the metal channel layer has a plurality of channels formed into its surface for conducting fluid through the channels;
a top seal disposed on the metal channel layer, wherein the top seal has at least one inlet positioned to introduce a cooling liquid into the channels and at least one outlet positioned to allow outflow of the cooling liquid out of the channels;
a stiffener member disposed on the substrate; and
epoxy disposed between an outer edge of the packaged assembly and an inner portion of the stiffener member.

2. The device of claim 1, wherein top surfaces of the packaged assembly, the epoxy, and the stiffener member are planarized to form a uniform surface.

3. The device of claim 1, wherein the stiffener member is taller or shorter than the packaged assembly.

4. The device of claim 1, further comprising:
a pump coupled to the at least one inlet and the at least one outlet, the pump configured to pump fluid in via the at least one inlet, through the plurality of channels in the metal channel layer, and out via the at least one outlet.

5. The device of claim 1, wherein the metal channel layer comprises copper or silver.

6. The device of claim 1, wherein at least a portion of the plurality of channels of the metal channel layer are free of a metal floor exposing a portion of the packaged assembly at the bottom of the channels so as to provide a cooling liquid a direct contact with a top surface of the packaged assembly.

7. The device of claim 1, wherein the plurality of channels of the metal channel layer have a height to width aspect ratio between about 1:10 to about 10:1.

8. The device of claim 1, wherein the metal channel layer has a thickness from about 10 µm to about 500 µm or a pitch between the plurality of channels between about 1 µm to about 500 µm.

9. The device of claim 1, wherein the packaged assembly comprises at least one of a processor or a memory module.

10. A device comprising:
a packaged assembly disposed on a substrate;
a metal channel layer disposed directly on top of the packaged assembly, wherein the metal channel layer has a plurality of channels formed into its surface for conducting fluid through the channels; and
a top seal disposed on the metal channel layer, wherein the top seal has at least one inlet positioned to introduce a cooling liquid into the channels and at least one outlet positioned to allow outflow of the cooling liquid out of the channels,
wherein the packaged assembly comprises a plurality of silicon channels in addition to the plurality of the channels in the metal channel layer.

11. A device comprising:
a packaged assembly disposed on a substrate;
a metal channel layer disposed directly on top of the packaged assembly, wherein the metal channel layer has a plurality of channels formed into its surface for conducting fluid through the channels; and
a top seal disposed on the metal channel layer, wherein the top seal has at least one inlet positioned to introduce a cooling liquid into the channels and at least one outlet positioned to allow outflow of the cooling liquid out of the channels,
wherein the device comprises multiple, fluidically separated channels in the metal channel layer and multiple inlets and multiple outlets in the top seal for zone cooling of the packaged assembly.

12. A method of producing a device comprising:
providing a packaged assembly disposed on a substrate;
disposing a metal seed layer on top of the packaged assembly;
producing on top of the metal seed layer a metal channel layer with a plurality of channels formed into its surface; and
disposing a top seal having at least one inlet and at least one outlet on the metal channel layer.

13. The method of claim 12, further comprising:
coupling a pump to the at least one inlet and the at least one outlet, the pump configured to pump fluid in via the at least one inlet, through the plurality of channels in the metal channel layer, and out via the at least one outlet.

14. The method of claim 12, prior to disposing the metal seed layer on top of the packaged assembly, the method further comprising:
disposing a stiffener member on the substrate; and
disposing epoxy between the packaged assembly and the stiffener member,
wherein the epoxy is in contact with an outer edge of the packaged assembly and an inner portion of the stiffener member.

15. The method of claim 14, further comprising:
planarizing top surfaces of the packaged assembly, the epoxy, and the stiffener member.

16. The method of claim 15, wherein the planarized top surfaces have a uniform height across the packaged assembly, the epoxy, and the stiffener member with respect to the substrate.

17. The method of claim 12, wherein disposing the metal channel layer includes deposition via one of physical vapor deposition, chemical vapor deposition, or electroplating on the metal seed layer.

18. The method of claim 12, further comprising:
etching the metal seed layer so as to completely remove the metal seed layer at the plurality of channels.

19. The method of claim 12, wherein a portion of the packaged assembly includes silicon, the method further comprising:
   etching the silicon in the portion of the packaged assembly thereby forming a plurality of silicon channels in fluid communication with the plurality of channels in the metal channel.

20. The method of claim 12, wherein the device includes fluidically separated channels in the metal channel layer and multiple inlets and multiple outlets in the top seal for zone cooling of the packaged assembly.

21. The method of claim 12, wherein the metal seed layer has a thickness from about 10 µm to about 50 µm and the metal channel layer has a thickness from about 10 µm to about 500 µm.

22. The method of claim 12, wherein the metal channel layer comprises copper or silver.

23. The method of claim 12, wherein the plurality of channels have a height to width aspect ratio between about 1:10 to about 10:1.

24. The method of claim 12, wherein disposing the metal seed layer on top of the packaged assembly comprises disposing the metal seed layer on top of a plurality of packaged assemblies including the packaged assembly arranged on a wafer.

25. The method of claim 24, further comprising:
   singulating the wafer to obtain the packaged assembly for disposing on the substrate.

26. The method of claim 25, wherein the metal seed layer is disposed on top of the packaged assembly before the packaged assembly is disposed on the substrate.

27. The method of claim 25, further comprising:
   applying an epoxy between the packaged assembly disposed on the substrate and a stiffener surrounding the packaged assembly on the substrate; and
   applying a metal sealant layer on top of the applied epoxy.

28. The method of claim 12, wherein the metal seed layer is disposed on top of the packaged assembly after the packaged assembly is disposed on the substrate.

29. A system comprising:
   a packaged assembly disposed on a substrate;
   a metal channel layer having a plurality of channels disposed on top of the packaged assembly;
   a top seal disposed on the metal channel layer, wherein the top seal has at least one inlet and at least one outlet;
   a pump configured to pump a liquid into the channels via the at least one inlet, through the plurality of channels, and out of the channels via the at least one outlet;
   a stiffener member disposed on the substrate; and
   epoxy disposed between an outer edge of the packaged assembly and an inner portion of the stiffener member.

30. The device of claim 29, wherein the metal channel layer comprises copper or silver.

31. The device of claim 29, wherein the plurality of channels have a height to width aspect ratio between about 1:10 to about 10:1.

* * * * *